United States Patent
Liu (10) Patent No.: US 9,191,836 B2
(45) Date of Patent: Nov. 17, 2015

(54) SYSTEM AND METHOD FOR REDUCING INTERFERENCE IN WIRELESS COMMUNICATION SYSTEMS

(71) Applicant: Rueywen Liu, South Bend, IN (US)

(72) Inventor: Rueywen Liu, South Bend, IN (US)

(*) Notice: Subject to any disclaimer, the term of this patent is extended or adjusted under 35 U.S.C. 154(b) by 0 days.

(21) Appl. No.: 14/173,042

(22) Filed: Feb. 5, 2014

(65) Prior Publication Data
US 2014/0153494 A1  Jun. 5, 2014

Related U.S. Application Data

(63) Continuation of application No. 14/040,187, filed on Sep. 27, 2013.

(60) Provisional application No. 61/706,249, filed on Sep. 27, 2012.

(51) Int. Cl.
*H04W 24/02* (2009.01)
*H04B 1/10* (2006.01)
*H04B 1/12* (2006.01)
*H03H 21/00* (2006.01)
*H04B 3/32* (2006.01)

(52) U.S. Cl.
CPC .......... *H04W 24/02* (2013.01); *H03H 21/0027* (2013.01); *H04B 1/10* (2013.01); *H04B 1/109* (2013.01); *H04B 1/12* (2013.01); *H04B 1/126* (2013.01); *H04B 3/32* (2013.01)

(58) Field of Classification Search
None
See application file for complete search history.

(56) References Cited

U.S. PATENT DOCUMENTS

| | | | |
|---|---|---|---|
| 7,903,617 B2* | 3/2011 | Liu et al. | 370/335 |
| 2002/0061081 A1* | 5/2002 | Richards et al. | 375/346 |
| 2004/0171352 A1 | 9/2004 | Maeda et al. | |
| 2005/0031021 A1* | 2/2005 | Baker et al. | 375/142 |
| 2011/0105032 A1* | 5/2011 | Maruhashi et al. | 455/59 |
| 2013/0308475 A1 | 11/2013 | Celebi et al. | |

OTHER PUBLICATIONS

Shaoyi Xu, Zhiquan Bai, Qinghai Yang and Kyung Sup Kwak, Singular Value Decomposition-Based Algorithm for IEEE 802.11 la Interference Suppression in DS-UWB and TH-PAM UWB Systems, Proceedings of the International Symposium on Communications and Information Technologies, 2006, pp. 599-604.*

Alex Cartagena Gordillo and Ryuji Kohno, Frequency Domain Processing Techniques for Pulse Shape Modulated Ultra Wideband Systems, Journal of Communications and Networks, vol. 4, No. 9, Dec. 2007, pp. 482-489.*

(Continued)

*Primary Examiner* — Christopher Crutchfield
(74) *Attorney, Agent, or Firm* — Miller, Matthias & Hull LLP (57) ABSTRACT

A system and method for mitigating interference in a physical layer is disclosed. The system may include a transmitter configured to transmit a message, the message having appended to it an interference signal and a receiver configured to receive the message from the transmitter. The receiver may also include a singular value decomposition filter receiver into which the message is input, the singular value decomposition filter receiver configured to use singular value decomposition data from the interference signal to recover the message from the transmitter while substantially eliminating the interference signal. The interference signal may be co-channel with the message and/or the interference signal may be dominant to the message.

14 Claims, 7 Drawing Sheets

(56) References Cited

OTHER PUBLICATIONS

Shaoyi Xu Zhiquan Bai, Qinghai Yang and Kyung Sup Kwak, Suppression of IEEE 802.11a Interference Based on SVD Algorithm for DSUWB Communication Systems in Wireless Multipath Channels, Proceedings of the 2006 Asia Pacific Conference on Communicaitons, Aug. 2006, pp. 1-5.*

Shaoyi Xu, Zhiquan Bai, Qinghai Yang and Kyung Sup Kwak, Singular Value Decomposition-Based Algorithm for Suppression of IEEE 802.11a Interference in Multiple Access TH-UWB Systems, Proceedings of The 2007 International Conference on Cognitive Radio Oriented Wireless Networks and Communications, Aug. 3, 2007, pp. 105-111.*

* cited by examiner

SYSTEM AND METHOD FOR REDUCING INTERFERENCE IN WIRELESS COMMUNICATION SYSTEMS

CROSS-REFERENCE TO RELATED APPLICATIONS

This is a continuation patent application, which claims priority under 35 U.S.C. §120 to U.S. patent application Ser. No. 14/040,187 filed on Sep. 27, 2013, which in turns claims priority to U.S. Provisional Patent Application Ser. No. 61/706,249 filed on Sep. 27, 2012, the entirety of both applications being incorporated by reference herein.

TECHNICAL FIELD OF THE DISCLOSURE

The present disclosure relates generally to wireless communications and, more particularly, relates to a system and method for reducing interference in wireless communication messages transmitted and received in an unlicensed spectrum of the physical layer. The interference may be co-channel with the messages and/or the interference may be dominant to the messages.

BACKGROUND OF THE DISCLOSURE

Wireless communication systems have become a major way of communication, replacing conventional land-based communication systems in many applications. There are many types of wireless communication systems, such as, cellular phone systems, wireless local area networks (LAN), WiFi, ad-hoc networks and wireless sensor and control networks used in cyber-physical systems. While wirelessly communicating using a cellular phone is well known, the other wireless communication systems are growing rapidly.

One common problem frequently encountered in wireless interactions between a receiver and a transmitter is the presence of interfering signals or interference originating from devices other than the transmitter and the receiver. Depending on the type of the wireless communication, in some applications, this interference may be intentional, such as the jamming of military wireless transmissions. In other applications, the interference may be accidental, for example, resulting from multiple users sharing a common wireless channel with or without a base station. The presence of such interfering signals can compromise the ability of the receiver to discern the signal from the intended sender, resulting in a reduction, sometimes significant reduction, of information throughput of the wireless transmission from the transmitter to the receiver.

All wireless communication occurs through airwaves divided into various frequency bands. By virtue of using different frequency bands, various types of wireless technologies can use the airwaves simultaneously without interfering with one another. These frequency bands may be either licensed or unlicensed. To transmit over a licensed band, operators typically obtain a license by paying a licensing fee for the exclusive right to transmit on a particular frequency band. Thus, interference on a licensed band may be controlled. On the other hand, communications over an unlicensed band requires no license or special permission and, therefore, interference in the unlicensed spectrum may not be well controlled.

In at least some instances, the interference in an unlicensed spectrum may be significant compared to signal power. This is partly because the signal power may be kept small in an unlicensed spectrum to reduce interference to other user signals. Therefore, the signal to interference ratio (SIR) in an unlicensed spectrum may be very small, for example, around a negative thirty decibels (~−30 dB). Wireless communication systems, such as WiFi, may use the network layer of the unlicensed spectrum to avoid such interferences. However, communicating in the network layer may limit the throughput and the transmitting distance in the coverage area. More importantly, since communication in the network layer uses a public network, those communications may not be secure. To avoid the disadvantages of transmitting in the network layer, modem wireless communications may occur in the physical layer. However, in the physical layer, the interference may not be well controlled.

Two methods are typically used for mitigating interference in the physical layer. The first method uses a filter such as a low-pass, high-pass and/or a band-pass filter, which takes advantage of the frequency spectrum of the interferences. However, such filters may not be very useful in mitigating co-channel interferences. The second method uses a stochastic filter that takes advantage of the stochastic properties of the interferences. However, such filters may require cross correlations between a measured variable and the interference to be effective. Accurate cross correlation statistics are hard to obtain in the unlicensed spectrum and, without such statistics the stochastic filter may not function properly.

Accordingly, there exists a need for a new filter that may be utilized for effectively countering the negative effects of interfering signals in an unlicensed spectrum for communications in the physical layer.

SUMMARY OF THE DISCLOSURE

In accordance with at least some aspects of the present disclosure, a system for mitigating interference is disclosed. The system may include a transmitter configured to transmit a message, the message having appended to it an interference signal. The system may also include a receiver configured to receive the message from the transmitter. The receiver may also include a singular value decomposition filter receiver into which the message and the interference signal may be input, the singular value decomposition filter receiver configured to use singular value decomposition data from the interference signal to recover the message from the transmitter while substantially eliminating the interference signal.

In accordance with at least some other aspects of the present disclosure, a method for mitigating interference is disclosed. The method may include transmitting a message from a transmitter to a receiver, the message having appended to it an interference signal, receiving the message and the interference signal at a receiver and inputting the message and the interference signal into a singular value decomposition filter receiver at the receiver. The method may also include eliminating substantially the interference signal from the message by the singular value decomposition filter receiver using singular value decomposition values from the interference signal.

In accordance with yet other aspects of the present disclosure, a singular value decomposition filter receiver is disclosed. The singular value decomposition filter receiver may include a fast Fourier transform block to transform an incoming time domain signal into a frequency domain signal and a training stage to determine a filter value. The singular value decomposition filter receiver may also include an operating stage to utilize the filter value and the frequency domain signal to substantially eliminate an interference signal appended to a message.

These and other aspects and features of the present disclosure will be more readily understood upon reading the following description when taken in conjunction with the accompanying drawings.

While the present disclosure is susceptible to various modifications and alternative constructions, certain illustrative embodiments thereof, will be shown and described below in detail. It should be understood, however, that there is no intention to be limited to the specific embodiments disclosed, but on the contrary, the intention is to cover all modifications, alternative constructions, and equivalents along within the spirit and scope of the present disclosure.

DETAILED DESCRIPTION OF THE DISCLOSURE

Figure 1:
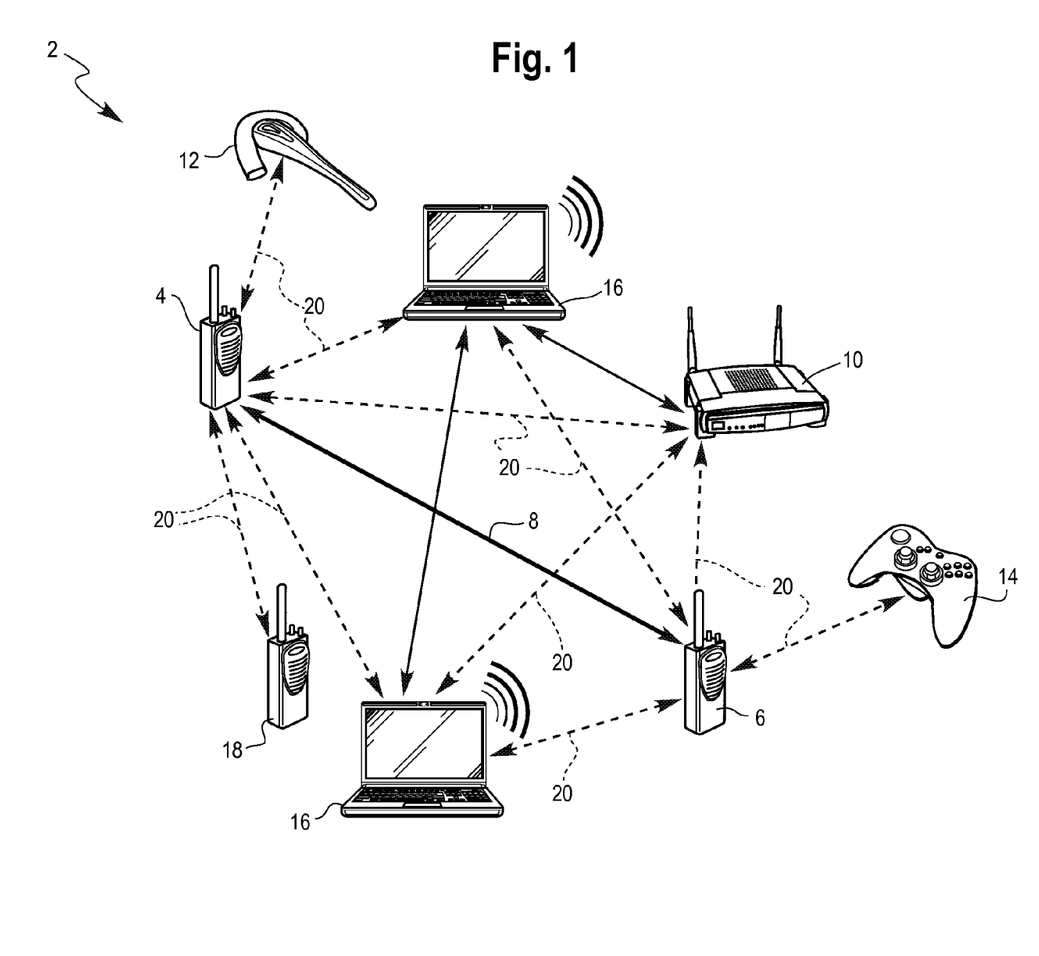
FIG. 1 is a schematic diagram illustrating exemplary types of wireless communication devices in which one embodiment of the present disclosure may be implemented.

Referring now to FIG. 1, an exemplary wireless communication system 2 illustrating certain types of wireless communication devices is shown, in accordance with at least some embodiments of the present disclosure. In at least some embodiments, the wireless communication system 2 may be a multi-user wireless communication system having several groups of users, with each user communicating with other users within its own group. Users of other groups may cause interference to the communicating users of a group. For example and as shown, the wireless communication system 2 may include a receiver 4 in communication with a transmitter 6 via a wireless channel 8 in a group. The wireless communication system 2 may also include other groups having wireless devices such as, a WiFi router 10, a Bluetooth earphone 12, a wireless game controller 14, computers 16 having WiFi and/or Bluetooth capabilities and an intercom device 18. These wireless devices may cause interference to the receiver 4 and the transmitter 6 by creating interference signals 20 when the receiver and the transmitter communicate with each other.

Notwithstanding the fact that in the present embodiment, only certain types of wireless devices have been shown, this is merely exemplary. In other embodiments, other types of wireless devices capable of creating interference signals are contemplated and considered within the scope of the present disclosure. Furthermore, the number of those wireless devices may vary as well. Additionally, it will be understood that only those components that are beneficial for a proper understanding of the disclosure are shown and described herein. Nevertheless, several other components that are commonly employed in wireless communications, such as a router, modem etc., are also contemplated and considered within the scope of this disclosure.

Although not shown, the receiver 4 may have a controller with a processing system configured to communicate with one or more volatile or non-volatile memory/storage devices, such as, flash memory, memory cards, read only memory (ROM), programmable read only memory (PROM), erasable programmable read only memory (EPROM), electronically erasable programmable read only memory (EEPROM), etc. The controller and particularly, the processing system of the controller may also be configured to run one or more software programs or applications stored in a memory location, read from a computer readable medium, and/or accessed from an external device operatively coupled to the controller by any suitable communication network. The transmitter 6 may be similarly configured as the receiver 4. Other devices, components and/or systems that are commonly employed in combination or conjunction with receivers and transmitters involved in wireless communications are contemplated and considered within the scope of the present disclosure.

Figure 2:
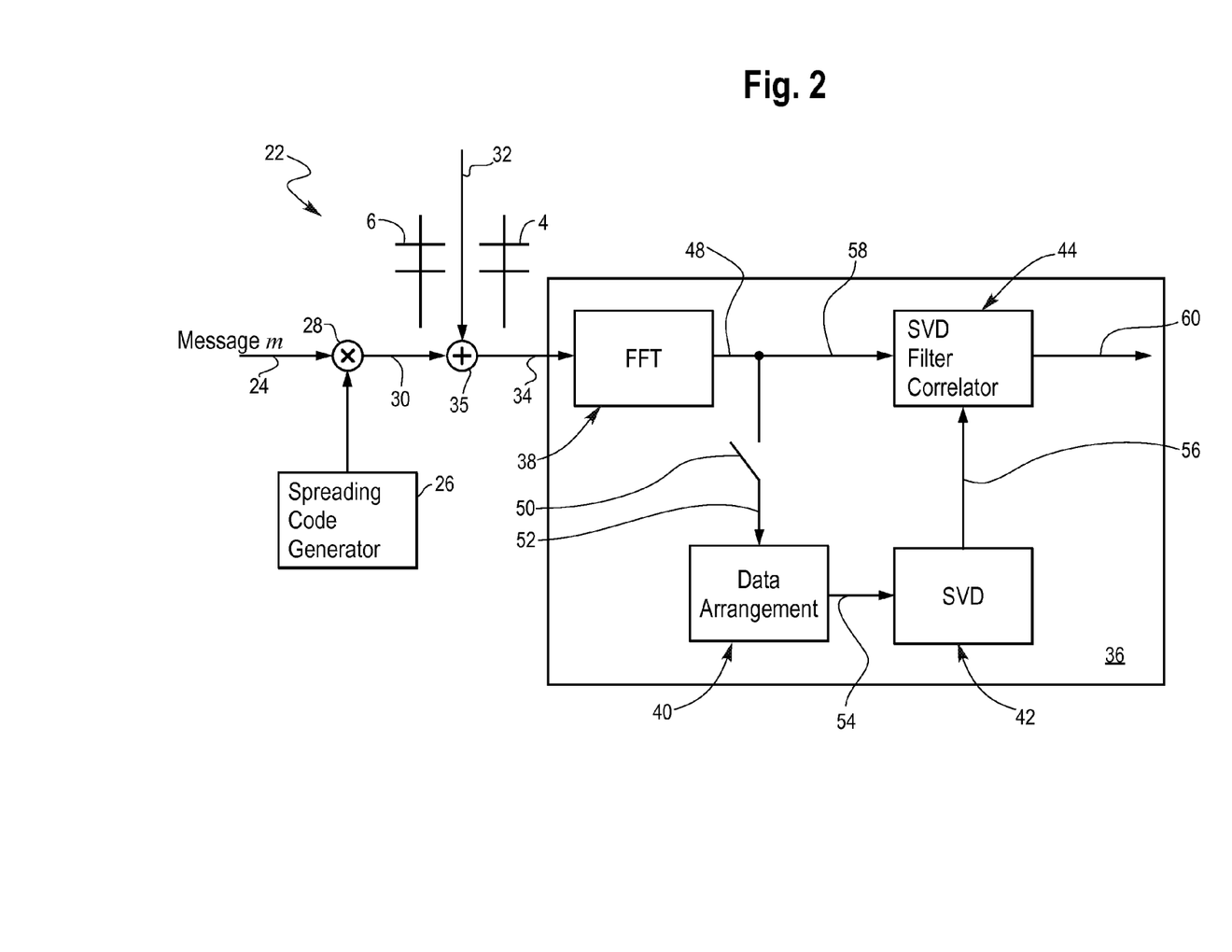
FIG. 2 is a an exemplary schematic illustration of an interference mitigation system employing a singular value decomposition (SVD) filter receiver, the interference mitigation system constructed in accordance with at least some embodiments of the present disclosure.

Referring now to FIG. 2, an exemplary interference mitigation system 22 for use in the wireless communication system 2 for mitigating interference in communications between the receiver 4 and the transmitter 6 in the physical layer is shown, in accordance with at least some embodiments of the present disclosure. Specifically, to mitigate interference, a message bit m, represented by arrow 24 may be combined with a code word d of length N. In at least some embodiments, the code word d may be a vector value designed to counteract interference signals. The code word d may be generated by a spreading code generator 26. The message bit m and the code word d may be combined in a first combination block 28. In at least some embodiments and as shown, the first combination block 28 may be a multiplication block in which a scalar value of the message bit m may be multiplied with the vector value of the code word d to yield a message md, represented by arrow 30. The message 30 may be transmitted by the transmitter 6 to the receiver 4. In at least some embodiments, the code word d need not be orthogonal to other code words generated by the spreading code generator 26. Furthermore, both d and N may be design parameters that may vary depending upon the receiver 4 and the transmitter 6.

The message 30 from the transmitter 6 on its way to the receiver 4 may pick up an interference signal 32, illustrated by symbol j, such that a received signal 34 at the receiver may look like:

$$x = md + j. \qquad (1)$$

In at least some embodiments, components in the received signal 34 other than the message 30 may be considered the interference signal 32. Also, in at least some embodiments, the interference signal 32 may include noise. Further, in at least some embodiments, the interference signal 32 may also include interferences from adjacent channels and co-channel interferences. The interference signal 32 may get attached to the message 30 in a second combination block 35 to generate the received signal 34. The term and in the received signal 34 may be compromised by the communication channel. However, for simplicity of explanation, the channel effect is not considered in mitigating the interference signal 32.

The receiver 4 may receive a series of N-sequences of the received signal 34. In other words, the received signal 34 may be segments of time series signals having data length N. For the kth N-sequence, the received signal 34 may be given by:

$$X[k]=m[k]d+j[k] \quad (2)$$

In at least some embodiments, the code word d may be known to the receiver 4 and the code word may be the same for all k, while the interference signal 32 and the message m may be unknown to the receiver. The object of the present disclosure is to retrieve the message m while mitigating the interference signal 32. In at least some embodiments, the signal power of the interference signal 32 may be larger than that of message m by around one thousand times. Such a difference between the message m and the interference signal 32 may typically be found in the physical layer of an unlicensed spectrum, in which the interference signals may not be regulated, while the signal powers may be kept small to prevent interference with other signals.

To mitigate the interference signal 32 and to recover the message m from the received signal 34, the received signal may be processed in a singular value decomposition (SVD) filter receiver 36. As will be explained further below, by virtue of using the SVD filter receiver 36, large interferences in the received signal 34 may be easily mitigated. As used herein, the term "mitigated" may mean making less severe or at least significantly less. In at least some embodiments, the interference signal 32 that may be mitigated may have signal to interference ratio SIR of, for example, negative thirty decibels (~−30 dB). In at least some embodiments, the SVD filter receiver 36 may include a Fast Fourier Transform (FFT) block 38, a data arrangement block 40, a singular value decomposition (SVD) block 42 and a singular value decomposition (SVD) filter correlator block 44. Further, the SVD filter receiver 36 may be a part of the receiver 4.

Thus, the received signal 34 may be processed by the SVD filter receiver 36 to mitigate the interference signal 32. Specifically, the received signal 34 may be input into the FFT block 38 to convert the received signal from a time domain into a frequency domain. The FFT block 38 may apply a fast Fourier transform to convert the received signal 34 into a frequency domain signal 48 as follows:

$$\tilde{x}[k]=m[k]\tilde{d}+\tilde{j}[k] \quad (3)$$

where the N-vector $\tilde{x}$ may be the Fourier transform of the N-sequence x in the frequency domain ($\omega_1, \omega_2, \ldots, \omega_N$):

$$\tilde{x}=[\tilde{x}(\omega_1)\ \tilde{x}(\omega_2)\ \ldots\ \tilde{x}(\omega_N)] \quad (4)$$

Similar equations may be written for $\tilde{d}$ and $\tilde{j}$. Furthermore, for simplicity of explanation and as stated above, we may assume that the sub-channels ($\omega_1, \omega_2, \ldots, \omega_N$) are far apart such that interference between neighboring sub-channels is little to none.

Before the frequency domain signal 48 may be processed in the SVD filter correlator block 44 to mitigate the interference signal 32, the SVD filter receiver 36 may need to be trained. To train the SVD filter receiver 36, a switch 50 between the FFT block 38 and the data arrangement block 40 may be closed and the message 24 may be set to zero. Thus, in the training stage, the message 24 may look like:

$$m[k]=0, \text{ for } k=1, 2, \ldots, N \quad (5)$$

By closing the switch 50, the frequency domain signal 48 may be input into the data arrangement block 40 via arrow 52. The data arrangement block 40 may utilize the interference data $\tilde{j}$ from the frequency domain signal 48 to generate an interference matrix $\hat{J}$:

$$\hat{J}=[\tilde{j}[1]\ \tilde{j}[2]\ \ldots\ \tilde{j}[N]] \quad (6)$$

The interference matrix $\hat{J}$ may be input into the SVD block 42 via arrow 54. In the SVD block 42, an SVD algorithm may be applied to the interference matrix $\hat{J}$ to obtain a filter value $\tilde{p}$, which may be utilized subsequently by the SVD filter correlator block 44 to mitigate the interference signal 32 after the SVD filter receiver 36 has been trained. To obtain the filter value $\tilde{p}$, a singular value decomposition (SVD) of the interference matrix $\hat{J}$ may be given by:

$$\hat{J}=U\Lambda V^* \quad (7)$$

where $\Lambda$ may be a diagonal matrix of singular values, which may be non-negative real numbers ordered top to bottom. Similarly, U and V may be unitary matrices with V* being the Hermitian value of V. Applying the diagonal and the unitary matrices to the interference matrix $\hat{J}$:

$$\hat{J} = [\ U_1\ \ u_N\ ]\begin{bmatrix} \Lambda_1 & 0 \\ 0 & \lambda_N \end{bmatrix}[\ V_1\ \ v_N\ ]* \quad (8)$$

where $\lambda_N$ may be the smallest singular value of $\hat{J}$, and $u_N$ and $v_N$ may be corresponding vectors in U and V. The filter value $\tilde{p}$ may be determined as follows:

$$\tilde{p}=u_N \quad (9)$$

Applying the filter value $\tilde{p}$ to equation (8) may obtain:

$$<\tilde{p},\hat{J}>=\lambda_N v^*_N \quad (10)$$

where $<\tilde{p},\hat{J}>$ may denote an inner product. The equality follows from the fact that U and V are unitary. Since V is a unitary matrix, equation 10 may be:

$$|<\tilde{p},\tilde{j}[k]>|\leq\lambda_N \quad (11)$$

where k=1, 2, . . . , N.

When $\lambda_N$=0 or in other words when the interference matrix $\hat{J}$ is singular, the filter value $\tilde{p}$ may eliminate $\tilde{j}[k]$ for k=1, 2, , , , . N. Additionally, when $\tilde{j}[k]$, for k>N, is in the range space of $U_1$, then $<\tilde{p},\tilde{j}[k]>$=0, because $<\tilde{p},U_1>$=0. Therefore, the filter value $\tilde{p}$ may at least substantially eliminate $\tilde{j}[k]$ for all k regardless of how strong $\tilde{j}[k]$ is. Specifically, if the following two conditions are satisfied, the filter value $\tilde{p}$ may be able to at least substantially eliminate the interferences $\tilde{j}[k]$ for all values of k regardless of the strength of the interference signal 32.

Condition 1: The interference matrix $\hat{J}$ is singular; and

Condition 2: The interference vectors $\tilde{j}[k]$ are in the range of $U_1$, or in other words, the interference vectors may be linear combinations of the column vectors of $U_1$.

Thus, the filter value $\tilde{p}$ may be obtained from the SVD values of the interference matrix $\hat{J}$, and the filtering action may be along the singular values of $\hat{J}$. The filter value $\tilde{p}$ determined by the SVD block 42 may be input into the SVD filter correlator block 44 via arrow 56 at the end of the training period. The SVD filter correlator block 44 may perform a correlation between two inputs: the filter value $\tilde{p}$ from the SVD block 42 and the frequency domain signal 48 $\tilde{x}$ from the FFT block 38 by $<\tilde{p},\tilde{x}[k]>$ to obtain an output 60.

Specifically, once the filter value $\tilde{p}$ is determined from the training stage, the switch 50 may be opened and the operating stage of the SVD filter receiver 36 may commence. In the operating stage, for k>N, the message bit m[k] and the frequency domain signal 48 may be transmitted to the SVD filter correlator block 44 via arrow 58. The SVD filter correlator block 44 may correlate the frequency domain signal x̃ 48 with the filter value p̃. The result of the correlation may be given by the output 60 as follows:

$$y[k] = <\tilde{p}, \tilde{x}[k]> = m[k]<\tilde{p}, \tilde{d}> + <\tilde{p}, \tilde{j}[k]> \qquad (12)$$

for k>N.

From the output 60, an instantaneous output SIR may be obtained as follows:

$$SIR[k] = \frac{\langle \tilde{p}, \tilde{d} \rangle^2}{\langle \tilde{p}, \tilde{j}[k] \rangle^2} \qquad (13)$$

for any k. To obtain the SIR, the magnitude of the message 30 may be assumed to be one. The SVD filter correlator block 44 may eliminate the components j̃[k] of interferences instantaneously, which may be in the range of $U_1$.

Thus, in view of (11), with the magnitude of the message 30 being one, the SIR at the output 60 of the SVD filter correlator block 44 to mitigate the interference signal 32 may be given by its lower bound:

$$SIR \geq \frac{\langle \tilde{p}, \tilde{d} \rangle^2}{\lambda_N^2}$$

Referring still to FIG. 2, two examples for mitigating the interference signal satisfying the two conditions mentioned above (Condition 1: The interference matrix Ĵ is singular; and Condition 2: The interference vectors ĵ[k] are in the range of $U_1$) will now be described.

EXAMPLE 1

Periodical Interference without Noise

The first example illustrates a scenario when the interference signal 32 may be periodical having a period T. A signal is periodic when it completes a pattern within a specific time period, known as the period. If the interference signal 32 is periodic, then we may choose N>T. In this case, the first column and the (T+1)-th column of the interference matrix Ĵ determined by the data arrangement block 40 may be the same. Hence, Ĵ may be a singular matrix. Since the interference signal 32 is periodic with T<N, the interference vectors ĵ[k] of the interference matrix Ĵ for all values of k may be in the range of $U_1$. Therefore, the two conditions mentioned above may be satisfied. The filter value p̃ generated by the SVD block 42 may be configured to at least substantially eliminate periodical interference signals, regardless of the strength of the signal. Thus, <p̃, j̃[k]>=0, for all k In view of equation (13), the output SIR may be infinitely large. In view of equation (12), the output 60 of the SVD filter correlator block 44 may be given by, $$y[k] = m[k]<\tilde{p}, \tilde{d}> \qquad (14)$$

Since <p̃,d̃> is a constant, the message 30 may be recovered from y[k].

Thus and as will be described below with respect to FIGS. 3 and 5, the SIR ratio of the interference signal 32, in at least some embodiments, may be increased from around a negative thirty decibels (~−30 db) to around a positive two hundred decibels (~+200 db), or in other words from $10^{-3}$ to $10^{20}$ by the SVD filter receiver 36.

EXAMPLE 2

Periodical Interferences with Noise

In contrast to example 1 described above in which the interference signal 32 was without a noise component, the interference signal in the example 2 may include a noise component. Further, in example 1, when the output SIR ratio is around a positive two hundred decibels (~+200 dB), it is not because the signal power is high, but because the power of the interference signal may be near zero. The interference signal may be near zero because example 1 did not account for the noise component. It is to be noted that at the input of the SVD filter receiver 36 (when the received signal 34 is input into the FFT block 38), the noise component may be negligible relative to the interference signal 32. However, once the SVD filter correlator block 44 mitigates the interference signal 32 to near zero, the noise component may no longer be negligible.

Thus, in order to consider the noise component from the point of input of the received signal 34 into the SVD filter receiver 36, the interference signal 32 may be said to include two components as shown below:

$$j = j^0 + n \qquad (15)$$

Where the component $j^0$ may be the periodical interference signal, as in example 1, while the component n may be a zero-mean Gaussian and white noise component uncorrelated in time with variance $\sigma^2$. Furthermore, component n may be uncorrelated to component $j^0$. As such, with the interference signal 32 having the two components above, the interference matrix determined by the data arrangement block 40 in the training stage may be the sum of the two components:

$$\hat{J} = \hat{J}^0 + \hat{N} \qquad (16)$$

To obtain the above interference matrix, a linear property of FFT and data arrangement may be employed. Since $\hat{J}^0$ and $\hat{N}$ are uncorrelated:

$$Ex\{\hat{J}\hat{J}*\} = \hat{J}^0\hat{J}^0* + Ex\{\hat{N}\hat{N}*\}$$
$$= U^0(\Lambda^0)^2 U^0* + \sigma^2 I$$
$$= U^0[(\Lambda^0)^2 + \sigma^2 I]U^0*$$

In the above equation, the SVD of $\hat{J}^0$ may be given by:

$$\hat{J}^0 = U^0 \Lambda^0 V^{0*}$$

This equation may be the SVD of $Ex\{\hat{J}\hat{J}*\}$. Therefore, SVD of the interference matrix for the case with noise and without noise may be the same except that their singular values may be related by $$\Lambda^2 = (\Lambda^0)^2 + \sigma^2 I \qquad (17)$$

Furthermore, the SVD filter value p̃ for both examples may be the same as well. In particular, since $j^0$ is periodical, we have $$<\tilde{p}, \tilde{j}^0[k]> = 0, \text{ for all } k \qquad (18)$$

and hence, $$Ex\{<\tilde{p}, \tilde{j}[k]>^2\} = Ex\{<\tilde{p}, \tilde{j}^0[k]>^2 + <\tilde{p}, \tilde{n}>^2\} = \sigma^2$$

The first term in the above equation is the interference power that is zero and the second term is the noise power that is $\sigma^2$.

Thus, the signal to interference plus noise ratio (SINR) at the output of the SVD filter correlator block 44 may be given by:

$$SINR = \frac{\langle \tilde{p}, \tilde{d} \rangle^2}{\sigma^2} \qquad (19)$$

It is to be noted that while the denominator in equation 19 may not be improved, the numerator may be able to improve. Also, both $\tilde{p}$ and $\tilde{d}$ may be unit in magnitude. Thus:

$$\langle \tilde{p}, \tilde{d} \rangle \leq 1 \qquad (20)$$

Suppose the code word d is set to be the inverse FFT $\tilde{p}$:

$$d = IFFT(\tilde{p}) \qquad (21)$$

Then, $\langle \tilde{p}, \tilde{d} \rangle = 1$ and and SINR may become, $$SINR = \frac{1}{\sigma^2} = SIR \qquad (22)$$

Thus, the SVD filter receiver 36 may achieve the limit or the SNR at the input without the interference.

Furthermore, if there is some N, for which all the N-sequences of interference vectors $\tilde{j}[k]$ may be limited to a linear space with dimension M<N, the filter value $\tilde{p}$ estimated by the SVD block 42 in the training stage may be able to at least substantially eliminate all interference signals.

It is also to be understood that when the structure of the interference signal varies with time, the SVD filter receiver 36 may be adapted to reflect the variance in the interference signal. This adaption may be attained by repeating the training stage to obtain a representative interference matrix and the filter value.

In another embodiment of the present disclosure, the SVD filter receiver 36 may also be used to mitigate interferences when there are multiple users in a network. Thus, assuming that there are M users in a network, the received signal 34 may be given as:

$$x = m_1 d_1 + \sum_{i=2}^{M} m_i d_i + j \qquad (23)$$

Where the first term is the desired signal, the second term is for other users, and the third term is the interference signal 32. In at least some embodiments, the second term and the third term may be combined to form a new interference signal:

$$x = m_1 d_1 + \bar{j} \qquad (24)$$
where $$\bar{j} = \sum_{i=2}^{M} m_i d_i + j \qquad (25)$$

The training stage described above may be applied to equation (24) to obtain the filter value $\tilde{p}$. However, $d_1$ may not be arbitrarily set as was set in equation (23), particularly because the set of code sequences $\{d_1, d_2, \ldots, d_M\}$ may be related together. For example, in some instances the code sequences may be orthogonal to each other in which case, a rotation operator may be used on the code sequences. Thus, the N-sequence for the code word $d_1$ may be denoted by $$d_1 = (\beta_1, \beta_2, \ldots, \beta_N) \qquad (26)$$

Let $d_1^{(\alpha)}$ denote the vector when $d_1$ rotates clockwise $\alpha$ times, i.e., $$d_1^{(\alpha)} = (\beta_{\alpha+1}, \ldots, \beta_N, \beta_1, \ldots, \beta_\alpha) \qquad (27)$$

Then, the optimal rotation may be chosen by:

$$\alpha^o = \underset{\alpha}{\mathrm{Max}} \langle \tilde{p}, \tilde{d}_1^{(\alpha)} \rangle \qquad (28)$$

where $\tilde{d}_1^{(\alpha)}$ may be the FFT of $d_1^{(\alpha)}$.

Then, the message 30 may be transmitted as follows:

$$m d_1^{(\alpha)} \qquad (29)$$

The output 60 of the SVD filter correlator block 44 may be given by $$y[k] = m[k] \langle \tilde{p}, \tilde{d}^{(\alpha^o)} \rangle + \langle \tilde{p}, \tilde{j}[k] \rangle \qquad (30)$$

Hence, $$|y[k] - m[k] \langle \tilde{p}, \tilde{d}^{(\alpha^o)} \rangle| \leq \lambda_N \qquad (31)$$

The output SIR may be given by $$SIR \geq \frac{\langle \tilde{p}, \tilde{d}^{(\alpha^o)} \rangle^2}{\lambda_N^2} \qquad (32)$$

which may be the optimal SIR among all rotational code words in a multi-user network.

In yet another embodiment of the present disclosure, the SVD filter receiver 36 may be configured to eliminate the interference signal and recover the message bit m without utilizing the switch 50 and without using the interference matrix by utilizing a feedback. For example, in the equation (3) above, duplicated below:

$$\tilde{x}[k] = m[k]\tilde{d} + \tilde{j}[k]$$

where $\tilde{x}$, $\tilde{d}$, and $\tilde{j}$ are the received signal 34, the code word d and the interference signal 32 in the frequency domain, respectively, instead of using $\tilde{j}$, we may be able to utilize $\tilde{x}$ to generate the data matrix, $\hat{X}$ as follows:

$$\hat{X} = [\tilde{x}[1] \, \tilde{x}[2] \ldots \tilde{x}[N]]$$

Then the SVD filter value $\tilde{p}$ may eliminate all column vectors of $\hat{X}$, i.e. $\langle \tilde{p}, \tilde{x}[k] \rangle = 0$ for $k = 1, 2, \ldots, N$.

And $m[k]\langle \tilde{p}, \tilde{d} \rangle + \langle \tilde{p}, \tilde{j}[k] \rangle = 0$ If $m[k]\tilde{d}$ and $\tilde{j}[k]$ may be statistically uncorrelated, then $\langle \tilde{p}, \tilde{j}[k] \rangle = 0$ and $m[k]\langle \tilde{p}, \tilde{d} \rangle = 0$.

Therefore, the SVD filter receiver 36 may eliminate both the interference signal 32 and the message bit m. However, if the information of the SVD-filter $\tilde{p}$ is fed back to the transmitter 6 and the transmitter transmits the message bit m by m[k]p, where p is the inverse Fourier Transformation of $\tilde{p}$, then the "new" received signal may be given by:

$$\tilde{x}[k] = m[k]\tilde{p} + \tilde{j}[k]$$

With the above equation, the output 60 of the SVD filter correlator block 44 may be given by $$y[k] = \langle \tilde{p}, \tilde{x}[k] \rangle = m[k]\langle \tilde{p}, \tilde{p} \rangle + \langle \tilde{p}, \tilde{j}[k] \rangle = m[k]$$

Here, the second term may be zero because the SVD filter value p̃ may eliminate the interference signal 32 and recover the message bit m.

Figure 3:
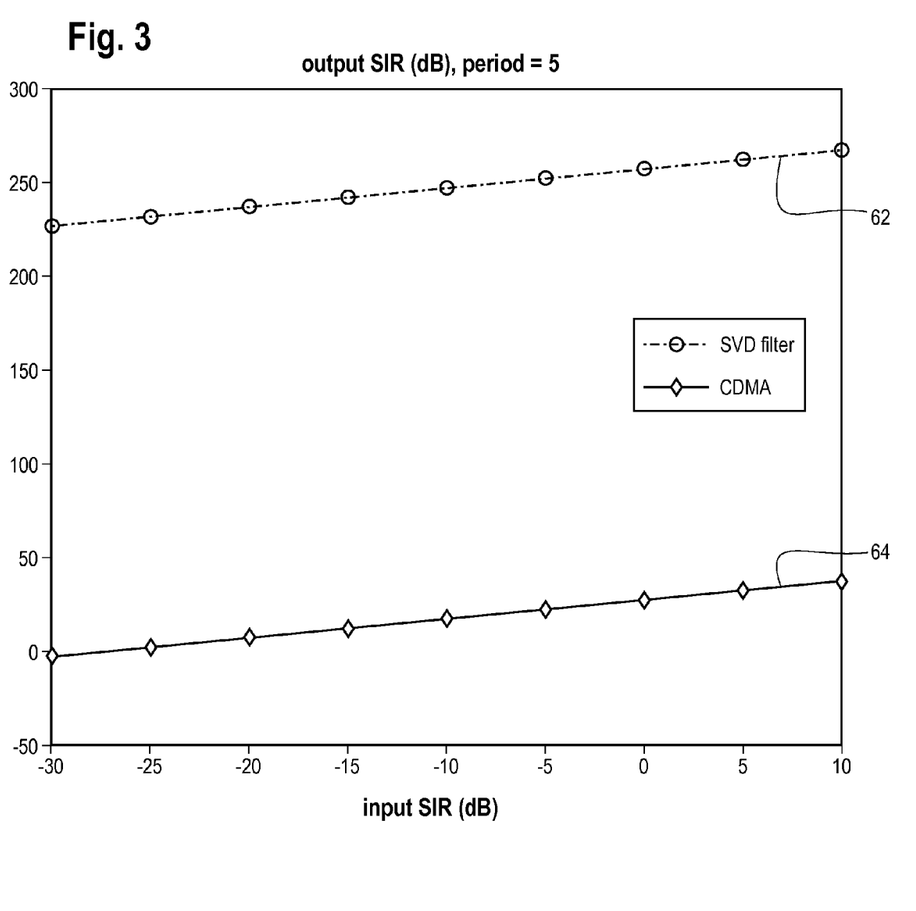
FIG. 3 is a graphical representation illustrating the performance of the SVD filter receiver of FIG. 2 for a sine wave signal without noise relative to a conventional code division multiple access (CDMA) filter, in accordance with at least some embodiments of the present disclosure.
Figure 4:
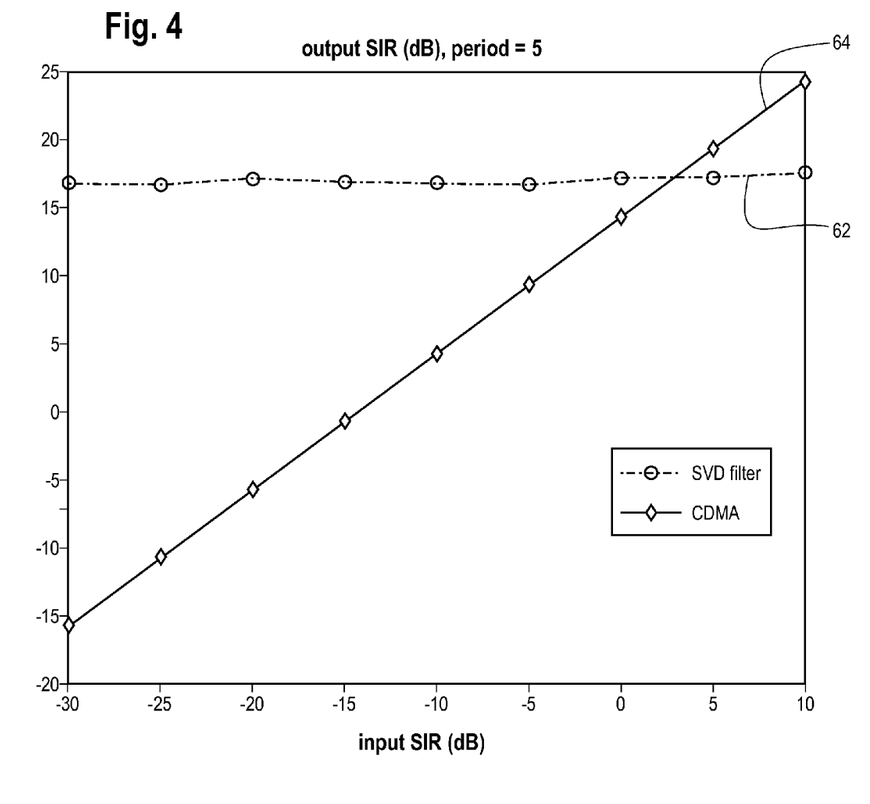
FIG. 4 is another graphical representation illustrating the performance of the SVD filter receiver of FIG. 2 for a sine wave signal with noise relative to the CDMA filter, in accordance with at least some embodiments of the present disclosure.
Figure 5:
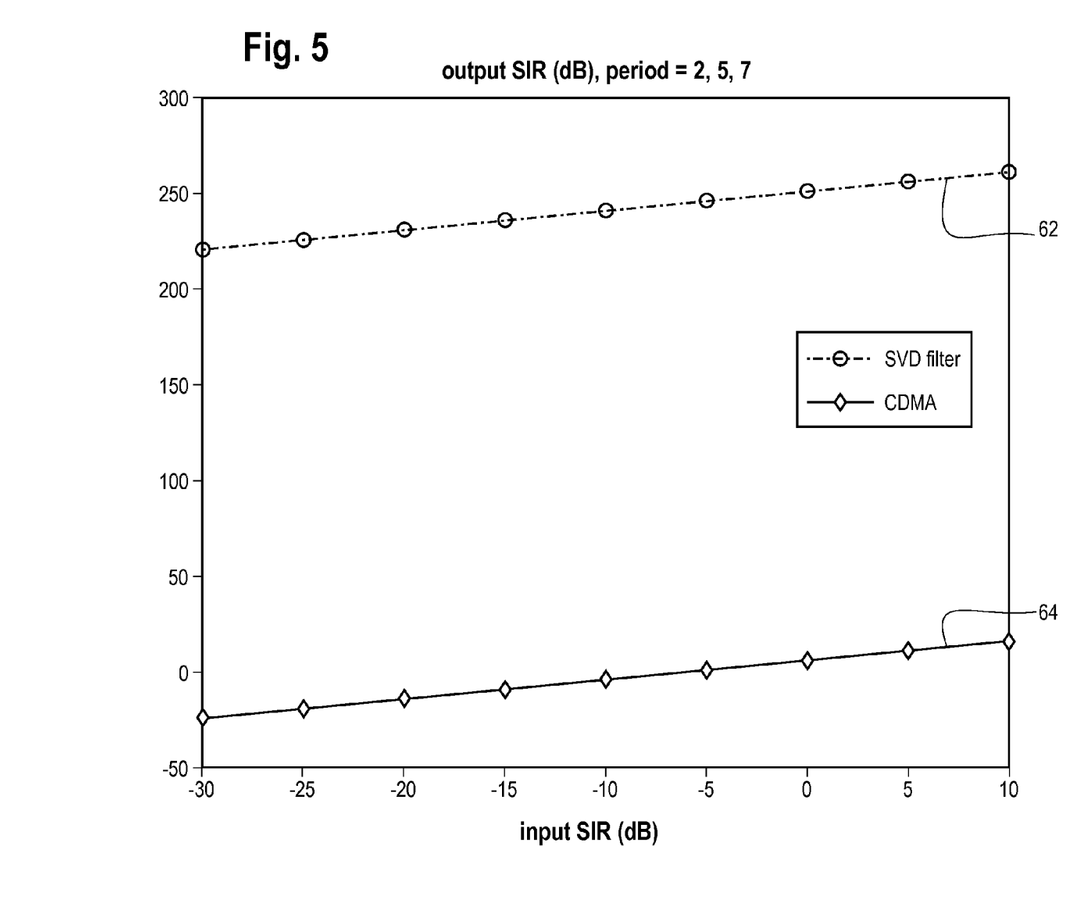
FIG. 5 is yet another graphical representation illustrating the performance of the SVD filter receiver of FIG. 2 for a combination of sine wave signals without noise relative to the conventional CDMA filter, in accordance with at least some embodiments of the present disclosure.
Figure 6:
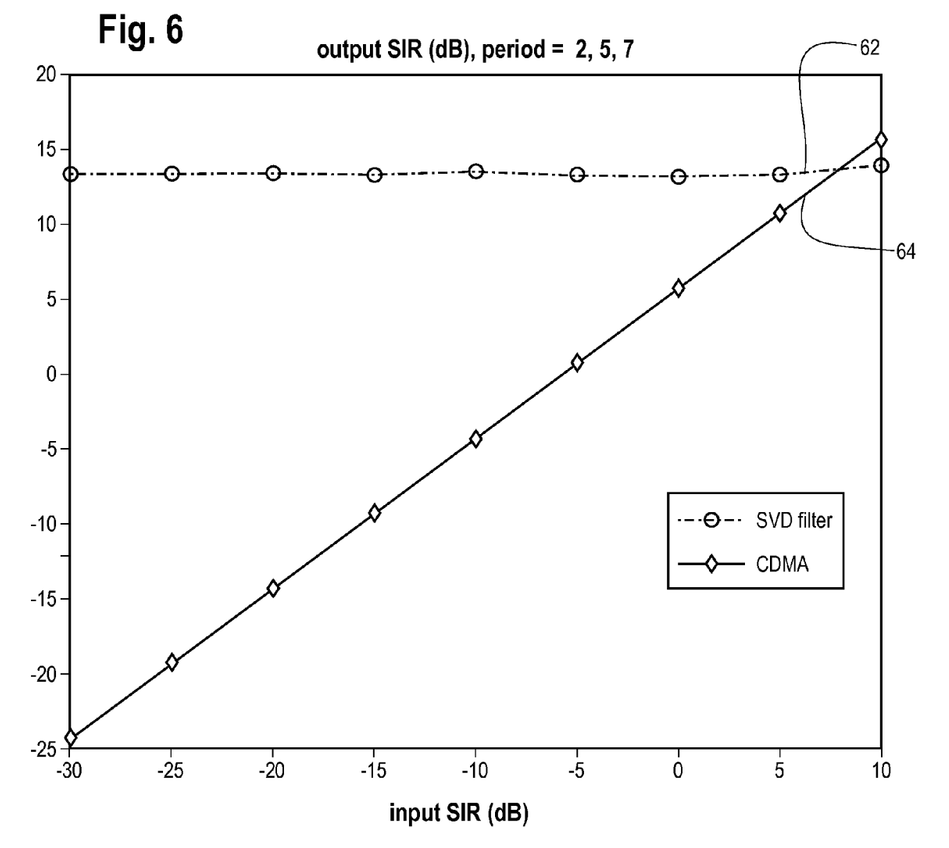
FIG. 6 is also a graphical representation illustrating the performance of the SVD filter receiver of FIG. 2 for a combination of sine wave signals with noise relative to the conventional CDMA filter, in accordance with at least some embodiments of the present disclosure.

Turning now to FIGS. 3-6, various graphical representations illustrating the performances of the SVD filter receiver 36 described above are shown relative to a conventional code division multiple access (CDMA) filter, in accordance with at least some embodiments of the present disclosure. The graphs shown include two periodical signals: a sine wave and a combination of three sine waves. Further, each type of periodic signal is illustrated with and without noise. Thus, FIG. 3 illustrates the performance of the SVD filter receiver 36 for a sine wave signal without noise, while FIG. 4 illustrates the performance of the SVD filter receiver for a sine wave signal with noise. Similarly, FIG. 5 shows the performance of the SVD filter receiver 36 for a combination of three sine wave signals without noise and FIG. 6 illustrates the performance of the SVD filter receiver for a combination of the three sine wave signals with noise.

Further, the period of the sine wave signal graphs shown in FIGS. 3 and 4 has been arbitrarily chosen to be five (5), while the periods of the three sine wave signal graphs shown in FIGS. 5 and 6 have been arbitrarily chosen to be two (2), five (5), and seven (7). Similarly, the phases of the signals in all of FIGS. 3-6 have been randomly chosen. Additionally, the graphs show average values of around a thousand trials. Each graph has plotted on its X-axis the input SIR value and on its Y-axis the output SINR value. Further, in each graph, plot 62 refers to the SVD filter receiver 36, while plot 64 refers to a conventional CDMA filter. Also, for FIGS. 4 and 6, the SNR value has been set at 10. It is also to be noted that at the input, the interference is much larger than the noise and thus the SINR is approximated by SIR while at the output, the interference is almost eliminated, and thus it is close to the SNR at the input when the interference is absent.

Referring specifically now to FIG. 3, performance of the SVD filter receiver 36 for a sine wave signal without noise is shown, in accordance with at least some embodiments of the present disclosure. As may be observed from the plots 62 and 64, the first data point on the plots refer to an input SIR of a negative thirty decibels (−30 dB), which may be equivalent to an interference signal that may be a thousand (1000) times the power of the message bit m. The output SIR on the Y-axis corresponding to negative thirty decibels (−30 dB) is shown to be a positive two hundred decibels (+200 dB) for the SVD filter plot 62 and around a negative twenty five decibels (−25 dB) for the CDMA plot 64.

Thus, the SVD filter plot shows 62 that the interference signal 32 is mitigated by about $10^{-20}$ times the signal power. In other words, the interference signal 32 is practically zero at the output of the SVD filter receiver 36 or that the interference signal is substantially eliminated even when the interference signal at the input is a thousand (1000) times the message bit m. In contrast to the SVD filter plot 62, it may be seen that the output SIR of the CDMA filter at the first data point of a negative thirty decibels (−30 dB) is still pretty significant. Thus, the SVD filter receiver 36 performs better than a comparable CDMA filter.

Similar results may be seen for the remaining data points with the interference signal at the input ranging from a thousand times to one tenth of the message bit m where the plot 62 for the SVD filter receiver 36 substantially eliminates the interference as shown by the output SIR for each data point.

With respect to FIG. 4, which shows the performance of the SVD filter receiver 36 for a sine wave with noise, the SNR may be set at ten (10) at the input. The SINR at the output may also be 10 if the interference is completely eliminated. Thus, at the input, the interference is much larger than the noise. The SINR may be substantially same as the SIR:

$$\text{SNIR at the Input} = \frac{1}{1000 + 0.1} \frac{1}{1000} = SIR$$

At the output, if the interference is eliminated by the SVD filter receiver 36, then:

$$\text{SINR at the Output} = \frac{1}{0.1} = 10$$

which is the same as the SNR at the input without the interference. In other words, the SVD-filter may be able to make the channel with significant interference to be one without interference.

Therefore, the improvement in SINR is $10^4$ when the interference is substantially eliminated. Also, the noise power 0.1 may be insignificant at the input but may be dominant at the output after the interference is completely eliminated. The improvement may vary based upon data throughput, coverage area, and user capacity.

Similar to FIG. 3, it may be seen from FIG. 4 that the plot 62 for the SVD filter receiver 36 performs better than the plot 64 for the CDMA filter. However, the plot 62 for the SVD filter receiver 36 shows that the SINR at the output is slightly better than ten (10) and that the SNR value at the input when the interference is absent is the upper limit to the SINR at the output. This may be due to the short data-length effect and that the noise may not be perfectly white. Nonetheless, any value at the output may still evidence a substantial mitigation of the interference. Thus, interference may be substantially eliminated even if a noise component is present in the message 30 along with the interference signal 32.

FIGS. 5 and 6, as discussed above, illustrate and compare the performance of the SVD filter receiver 36 with that of a conventional CDMA filter for a three sine wave signal. As can be seen, the results of FIG. 5 closely track the results of FIG. 3, while the results of FIG. 6 closely track the results of FIG. 4. Therefore, for conciseness of expression, FIGS. 5 and 6 have not been explained again.

Figure 7:
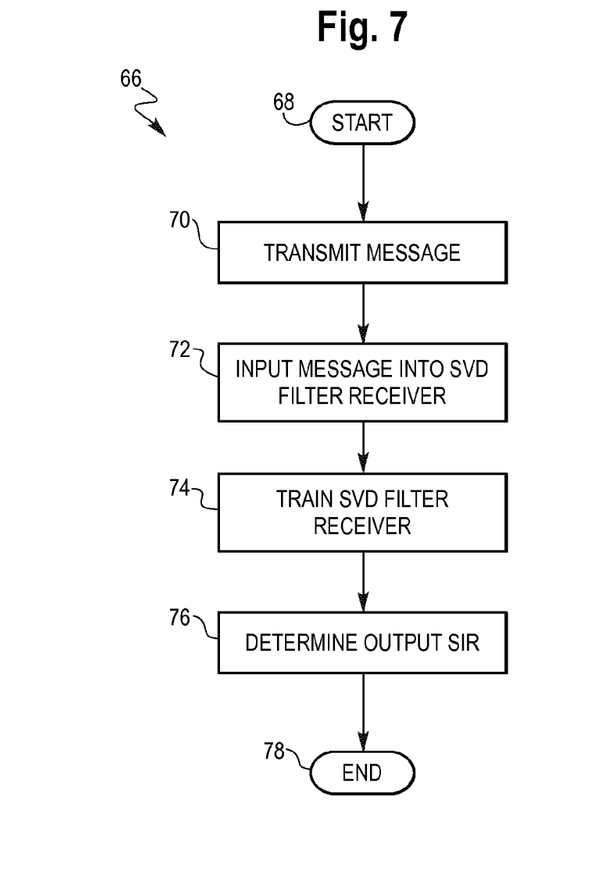
FIG. 7 is an exemplary flowchart outlining steps for mitigating interference using the SVD filter receiver of FIG. 2.

Turning now to FIG. 7, an exemplary flowchart 66 outlining steps of mitigating interference for signals transmitted in the physical layer are shown, in accordance with at least some embodiments of the present disclosure. Thus, after starting at a step 68, the process proceeds to a step 70 where the message 30 may be sent from the transmitter 6 to the receiver 4. As discussed above, on its way to the receiver 4, the message 30 may pick up the interference signal 32. In at least some embodiments, the message 30 may also pick up a noise signal. At the receiver 4, the message 30 along with the interference signal 32 and the noise signal, if present, may be termed as the received signal 34 that may be input into the SVD filter receiver 36 at a step 72. In the SVD filter receiver 36, first the received signal 34 may be converted from a time domain into a frequency domain within the FFT block 38.

The frequency domain signal 48 output from the FFT block 38 may be utilized to train the SVD filter receiver 36 at a step 74. Specifically, the frequency domain signal 48 may be input into the data arrangement block 40, which may utilize the interference data from the frequency domain signal 48 to create an interference matrix. The interference matrix may be input into the SVD block 42 to determine a filter value. The filter value may then be transmitted to the SVD filter correlator block 44. The SVD filter correlator block 44, at a step 76, may use the filter value and the frequency domain signal 48 from the FFT block 38 to determine the output 60. The output 60 may be representative of the extracted message bit from the message 30 from which the interference signal 32 has been substantially eliminated. From the output 60, an SIR value may be computed to illustrate the mitigation of the interference signal 32.

Thus, by virtue of using an SVD filter receiver in the physical layer of an unlicensed wireless spectrum, large interference signals may be effectively and substantially eliminated. In at least some embodiments and as discussed above, the SVD filter receiver may be capable of mitigating interference signals that are about a thousand times larger than the message bit.

While only certain embodiments have been set forth, alternatives and modifications will be apparent from the above description to those skilled in the art. These and other alternatives are considered equivalents and within the spirit and scope of this disclosure and the appended claims.

What is claimed is:

1. A system for mitigating interference, the system comprising:
   a transmitter configured to transmit a message, the message having appended to it an interference signal; and
   a receiver configured to receive the message from the transmitter and input the message into a singular value decomposition filter receiver, the singular value decomposition filter receiver comprising:
      a controller to transform the incoming message having the interference signal appended to it with a fast Fourier transform into a frequency domain signal;
      a training stage to determine a filter value; and
      an operating stage to utilize the filter value and the frequency domain signal to substantially eliminate the interference signal appended to the message.

2. The system of claim 1, wherein the system is used to substantially eliminate the interference signal in a physical layer of an unlicensed wireless network.

3. The system of claim 1, wherein the training stage of the singular value decomposition filter receiver receives the frequency domain signal and determines an interference matrix by extracting singular value decomposition values of the interference signal from the frequency domain signal, and a singular value decomposer configured to receive the interference matrix from the data arrangement and determine the filter value from the interference matrix.

4. The system of claim 3, wherein the singular value decomposition filter receiver further comprises a switch between the fast Fourier transform and the data arrangement, the switch being closed only in the training stage.

5. The system of claim 3, wherein the operating stage of the singular value decomposition filter receiver further comprises a singular value decomposition filter correlator by the controller that receives the frequency domain signal and the filter value from the training stage to recover the message while substantially eliminating the interference signal from the frequency domain signal.

6. The system of claim 1, wherein the singular value decomposition filter receiver is further configured to substantially eliminate the interference signal when the interference signal includes a noise signal.

7. The system of claim 1, wherein the singular value decomposition filter receiver can substantially eliminate the interference signal when the interference signal is thousand times than the message.

8. A method for mitigating interference, comprising:
   transmitting a message from a transmitter to a receiver, the message having appended to it an interference signal;
   receiving the message and the interference signal at a receiver;
   inputting the message and the interference signal into a singular value decomposition filter receiver at the receiver; and
   eliminating substantially the interference signal from the message by the singular value decomposition filter receiver using singular value decomposition values from the interference signal wherein the singular value decomposition filter receiver converts the message and the interference signal into a frequency domain signal using a fast Fourier transform block.

9. The method of claim 8, wherein the frequency domain signal is input into a data arrangement block if a switch between the fast Fourier transform block and the data arrangement block is closed, the data arrangement block extracting the singular value decomposition values from the interference signal to determine an interference matrix.

10. The method of claim 8, wherein for an input signal to interference ratio of a negative thirty decibels, the singular value decomposition filter receiver provides an output signal to interference ratio of a positive two hundred decibels.

11. A singular value decomposition filter receiver, comprising:
   a fast Fourier transform block to transform an incoming time domain signal into a frequency domain signal;
   a training stage to determine a filter value; and
   an operating stage to utilize the filter value and the frequency domain signal to substantially eliminate an interference signal appended to a message.

12. The singular value decomposition filter receiver of claim 11, wherein the training stage comprises:
   a data arrangement block configured to receive the frequency domain signal and determine an interference matrix by extracting singular value decomposition values of the interference signal from the frequency domain signal; and
   a singular value decomposition block configured to receive the interference matrix from the data arrangement block and determine the filter value from the interference matrix.

13. The singular value decomposition filter receiver of claim 12, further comprising a switch between the fast Fourier transform block and the data arrangement block, the switch being closed only in the training stage.

14. The singular value decomposition filter receiver of claim 11, wherein the operating stage comprises a singular value decomposition filter correlator that receives the frequency domain signal and the filter value from the training stage to recover the message while substantially eliminating the interference signal from the frequency domain signal.

* * * * *